(12) United States Patent
Tsironis

(10) Patent No.: US 12,732,164 B1
(45) **Date of Patent: *Sep. 8, 2026**

(54) VHF-UHF HARMONIC LOAD PULL TUNER

(71) Applicant: Christos Tsironis, St-Laurent (CA)

(72) Inventor: Christos Tsironis, Kirkland (CA)

(*) Notice: Subject to any disclaimer, the term of this patent is extended or adjusted under 35 U.S.C. 154(b) by 351 days.

This patent is subject to a terminal disclaimer.

(21) Appl. No.: 18/524,802

(22) Filed: Nov. 30, 2023

(51) Int. Cl.
*H03H 7/40* (2006.01)
*H03J 3/20* (2006.01)
*H03J 5/30* (2006.01)

(52) U.S. Cl.
CPC ................ *H03J 5/30* (2013.01); *H03H 7/40* (2013.01); *H03J 3/20* (2013.01)

(58) Field of Classification Search
CPC .... H03H 7/38; H03H 7/40; H01P 5/04; H01P 3/023; G01R 31/2822; G01R 27/32; G01R 27/04
USPC .......................................................... 333/263
See application file for complete search history.

(56) References Cited

U.S. PATENT DOCUMENTS 7,135,941 B1 11/2006 Tsironis
9,602,072 B1 * 3/2017 Tsironis .................. H03H 7/40
9,620,842 B1 * 4/2017 Tsironis .................. H03H 7/40
12,519,458 B1 * 1/2026 Tsironis .................... H03J 1/08
2013/0002367 A1 * 1/2013 Tsironis ................ H03H 7/185
333/139

OTHER PUBLICATIONS

"Load Pull" [online] Wikipedia, [Retrieved on Aug. 24, 2017]. Retrieved from Internet <URL: https://en.wikipedia.org/wiki/Load_pull>.
"Computer Controlled Microwave Tuner—CCMT", Product Note 41, Focus Microwaves Inc., Jan. 1998.
"Standing wave ratio" [online], Wikipedia, [Retrieved on Feb. 3, 2017]. Retrieved from Internet <URL: https://en.wikipedia.org/wiki/Standing_wave_ratio>.

* cited by examiner

*Primary Examiner* — Stephen E. Jones

(57) ABSTRACT

A new harmonic slide screw impedance tuner for VHF-UHF frequencies uses a reduced overall length spiral slabline structure and three rotating carriages allowing reducing the linear size of the tuner from originally L=3λ/2 to a spiral length L=2πRN of a cylinder with 2R diameter and a height H made up of N floors (example: F=100 MHz, λ=300 cm, R=10 cm, N=10 floors of 2 cm each, yields a 20×20 cm cylinder versus a 450 cm linear slabline; a core reduction of 450/20=23). The slabline stands vertically on the bench table surface and the carriages, including the tuning probes rotate and wind up and down around a vertical axis through the center of the spiral slabline, controlled by a rack- and pinion spiral arrangement on the edge of the spiral slabline. The rotation of the carriages controls the phase of GAMMA and the insertion of the tuning probes into the channel of the slabline controls its amplitude.

3 Claims, 9 Drawing Sheets

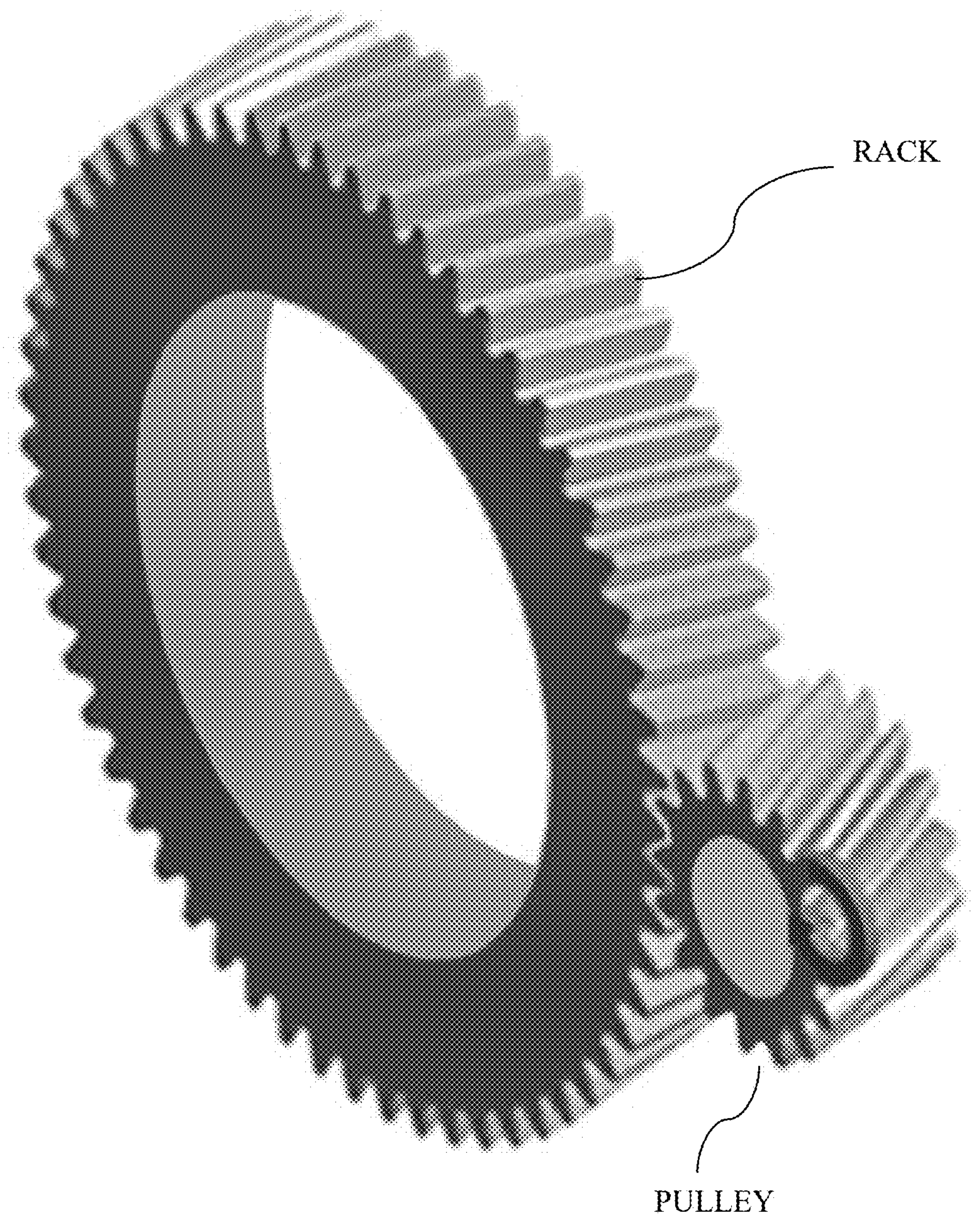
FIG. 9: Prior art

VHF-UHF HARMONIC LOAD PULL TUNER

PRIORITY CLAIM

Not Applicable

CROSS-REFERENCE TO RELATED ARTICLES

1. “Load Pull” [online] Wikipedia, [Retrieved on 2017 Aug. 24]. Retrieved from Internet <URL: https://en.wikipedia.org/wiki/Load_pull>.
2. “Computer Controlled Microwave Tuner—CCMT”, Product Note 41, Focus Microwaves, January 1998.
3. “Standing wave ratio” [online], Wikipedia, [Retrieved on 2017 Feb. 3]. Retrieved from Internet <URL: https://en.wikipedia.org/wiki/Standing_wave_ratio>.
4. Tsironis, C. U.S. Pat. No. 7,135,941, “Triple probe automatic slide screw load pull tuner and method”.

BACKGROUND OF THE INVENTION AND PRIOR ART

This invention relates to RF load and source pull testing of low noise as well as medium and high power VHF (30-300 MHz) and UHF (300-3000 MHz) transistors and amplifiers using remotely controlled electro-mechanical impedance tuners.

Modern design of low-noise or high-power VHF and UHF amplifiers, used in various communication systems, requires accurate knowledge of the active device’s (RF transistor’s) characteristics. In such circuits, it is insufficient for the transistors, which operate either as very low noise or as highly non-linear devices, close to power saturation, to be described using linear or non-linear numeric models.

A popular method for testing and characterizing such VHF and UHF components (transistors) in the non-linear region of operation is “load pull” or “source pull”. Load/source pull is a measurement technique employing impedance tuners and other RF test equipment (FIG. 1), such as signal source 1, input and output tuner 2, 4, power meter 5 and test fixture 3 which includes the DUT. The tuners and equipment are controlled by a computer 6 via digital cables 7, 8 and 9. The VHF and UHF impedance tuners are devices which allow manipulating the RF impedance presented to the Device Under Test (DUT, or transistor) to test (see ref. 1); this document refers hence to “impedance tuners”, in order to make a clear distinction to “tuned receivers (radios)”, popularly called elsewhere also “tuners” because of the included tuning circuits (see ref. 2).

Electro-mechanical impedance tuners (FIG. 2) in the RF frequency range between 100 MHz and 120 GHz are using the slide-screw concept and include a straight slabline 24 with a test port and an idle port, a center conductor 23 (also FIG. 3) and one or more mobile carriages 28 which have a width 220 and carry a remotely 20*a* controlled motor 20, a vertical axis 21 which controls vertical position 216 of a reflective probe 22. The carriages are moved horizontally 217 by additional motors (not shown) and gear 27. The signal enters one port 25 and exits from the other 26. In load pull the test port is the one where the signal enters, in source pull the test port is the one where the signal exits. The entire mechanism is, typically, integrated in a solid housing 215 since mechanical precision is of highest importance.

The typical configuration of the reflective probe inside the slabline is shown in FIG. 3: a number of parallel reflective tuning elements 31 also called “tuning” probes or slugs, are attached to a vertical screw using a pin 32 ands are inserted into the slotted transmission airline 34 and coupled capacitively with the center conductor to an adjustable degree, ranging from very weak (when the probe is withdrawn) to very strong (when the probe is very close (within electric discharge—or Corona) to the center conductor; it must be pointed that capacitive “tuning” probes are different from “sampling” probes, which are loosely coupled with the center conductor; when the tuning probes move vertically 36 between a “top position” and a “bottom position” and approach the center conductor 33 of the slabline 34 and moved along the axis 35 of the slabline, they alter the amplitude and phase of the reflection factors seen at the slabline ports, covering parts or the totality of the Smith chart (the normalized reflection factor area). The relation between reflection factor and impedance is given by GAMMA=(Z−Zo)/(Z+Zo), where Z is the complex impedance Z=R+jX and Zo is the characteristic impedance. A typical value used for Zo is 50 Ohms (see ref. 3). In a 50 Ohm test system (i.e. when the tuner is terminated at both ports with 50 Ohm), GAMMA is equal to the first element of the slabline s-parameter matrix: GAMMA=S11.

BRIEF DESCRIPTION OF THE INVENTION

Slide screw tuners require the reflective probe to travel at least one half of a wavelength ($\lambda/2$) along the transmission line at the frequency of operation in order to cover one circle on the reflection factor plan (Smith chart). This corresponds to 15 cm at 1 GHz and 1.5 m at 100 MHz. A harmonic tuner for the fundamental frequency Fo and the two harmonics 2Fo and 3Fo requires a triple of this length, plus the space for the mobile carriages, housing, gear etc., see ref. 4. For a 100 MHz harmonic tuner this comes to an approximately 5-meter long straight slabline. This is impossible to manufacture, handle and operate with enough precision in a laboratory environment. This invention thus proposes a spiral slabline of drastically reduced dimensions and associated mobile carriages allowing harmonic tuners in the VHF (30-300 MHz) and UHF (300 MHz-3 GHZ) frequency ranges. Immersing the slabline in a variety and mixture of dielectric fluids reduces the wavelength by the square root of the permittivity Er of the dielectric fluid and the required travel distance, it increases the capacitive coupling between tuning probe and center conductor (important for low frequencies) and increases the power handling by lowering the electric field density.

There are two types of tuning probes (FIGS. 4A and 4B). The probe of FIG. 4A is spring loaded 41-42, having a vertical slot 48 and makes continuous galvanic contact 40-41 with the slabline 46 walls as it moves towards or away 43 from the center conductor 49 and is therefore better suitable for a spiral slabline, of which the channel, even microscopically, is not completely straight. Other the tuning probe of FIG. 4B where the body has no flexibility and requires perfect straightness and alignment of the slabline 47 to maintain symmetrical and continuous capacitive coupling 44 of the slug 45 as it approaches 402 the center conductor 401.

BRIEF DESCRIPTION OF THE SEVERAL VIEWS OF THE DRAWINGS

The invention and its mode of operation will be easier understood from the following detailed description when read with the appended drawings in which:

FIG. 4A depicts a probe with galvanic ground contact to the slabline walls and spring-loaded mechanism; FIG. 4B depicts a probe with capacitive-only RF ground contact.

FIG. 9 depicts prior art, the concept of a rack-and-pinion configuration to be used in the present invention.

DETAILED DESCRIPTION OF THE INVENTION

Figure 5:
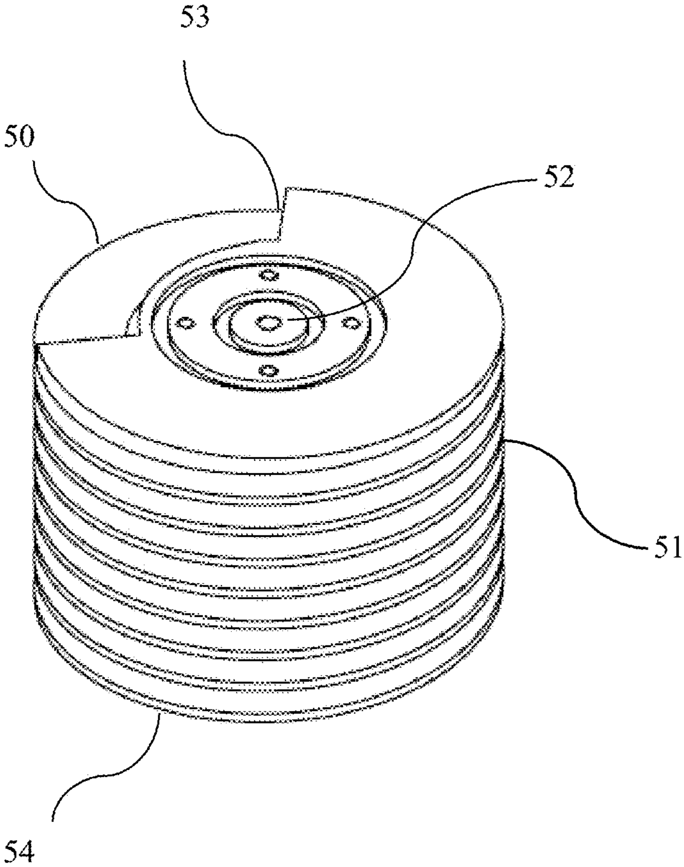
FIG. 5 depicts a 3D view of the core of the spiral slabline.

FIG. 5 is a perspective view of the cylindrical core of the spiral slabline. The cylinder has a center 52, a periphery lip 50 and a continuous spiral channel 51 in which is embedded a center conductor. The width of the channel and the diameter of the center conductor are dimensioned such as to create a characteristic impedance of 50 Ohms, if the slabline is submerged in dielectric fluid to increase its electrical length, the thermal control of the center conductor (cooling) and increase the capacitive coupling of the tuning probes with the center conductor, allowing for smaller tuning slugs.

Figure 6:
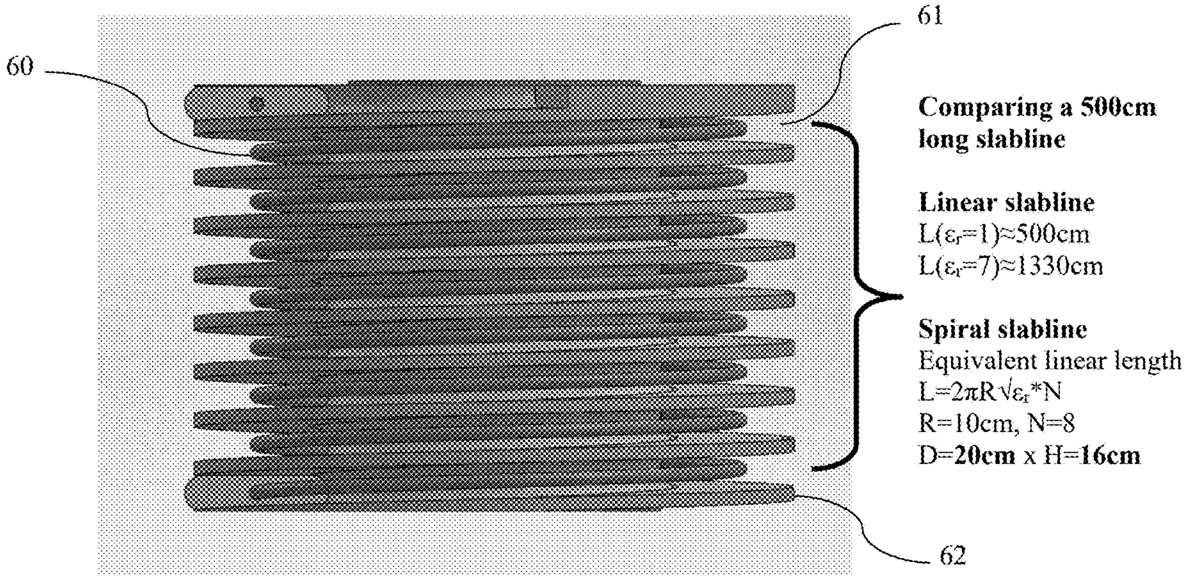
FIG. 6 depicts the spiral slabline including the center conductor.

FIG. 6 is a side view of the spiral slabline before the mounting of the mobile carriages. This embodiment includes N=8 spires 60 and cavities 61 between walls 62 on a cylinder with a radius R of 10 cm yielding a total linear length of 2πRN=503 cm in air, enough for a Fo, 2Fo and 3Fo (Fo=100 MHz) harmonic tuner or, if the spiral slabline is submerged in dielectric fluid with a permittivity of 4 (like vegetal oil), to a total length of 1006 cm, enough for a Fo=50 MHz Fo to 3Fo slide screw harmonic tuner. Generally speaking, the total linear effective length of the spiral slabline must be least equal to the number of mobile carriages used, times one half of a wavelength (λ/2) at a lowest frequency of operation of the slide screw tuner (see ref. 4), plus, of course, the space taken by inserting the carriages, connecting the end adapters etc.

Submerging the slabline in dielectric fluid also increases the capacitance between the tuning probe and the center conductor, cools the center conductor and increases the breakdown voltage, thus also increasing the RF power handling of the tuner. Using a mixture of high permittivity dielectric fluid (example glycerine with $\varepsilon_r$=40 with mineral oil of $\varepsilon_r$=2.1) and adjusting the proportions will yield any desired average permittivity value, assuming the liquid is steadily recirculated to avoid separation of the fluid components. At the relatively low frequencies considered here, the dielectric RF loss of the fluids is of minor concern.

Figure 7:
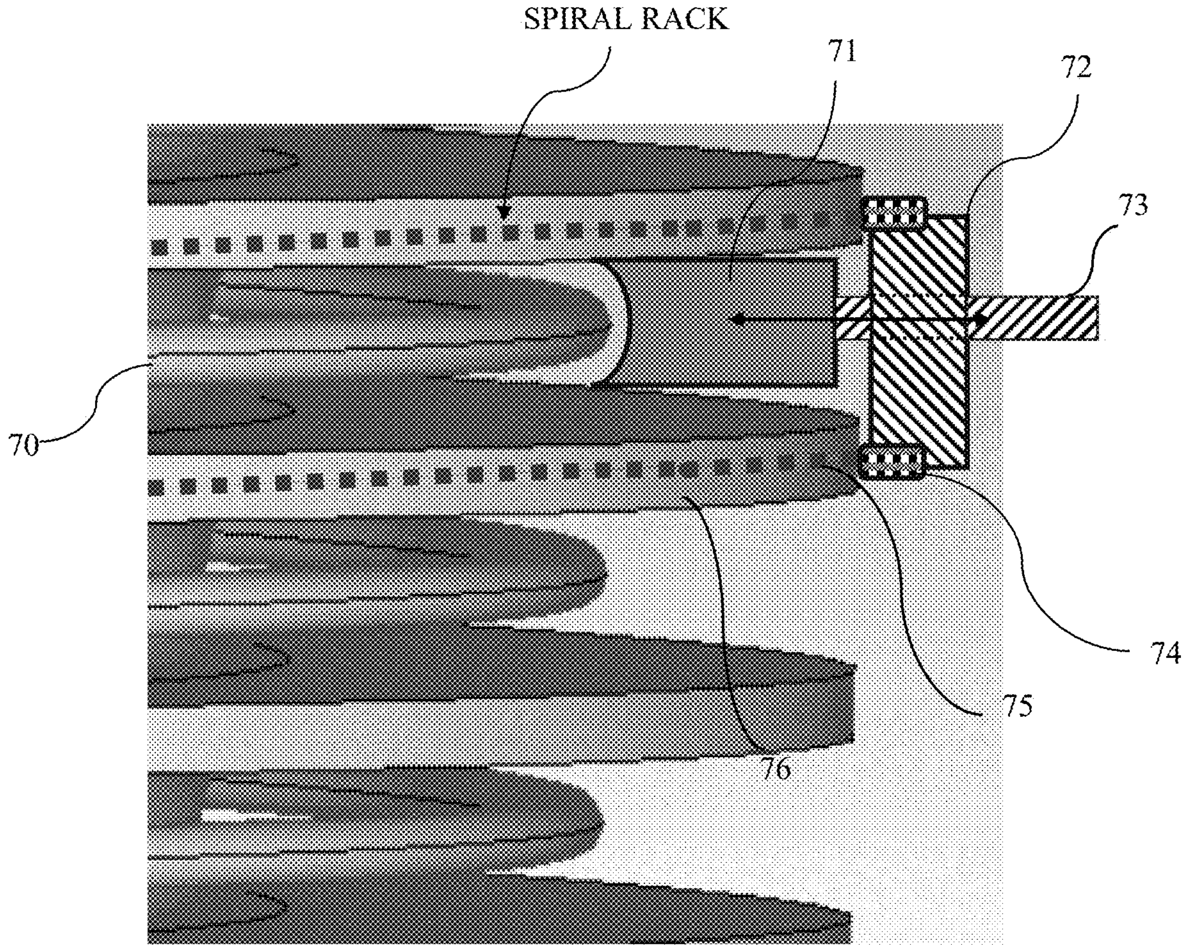
FIG. 7 depicts a detail view of a section of the spiral slabline and schematically a mobile carriage with tuning probe inserted in the channel.

FIG. 7 shows a detail of the tuning mechanism on the spiral slabline: one can see the conductive sidewalls 76, the teeth on the periphery 75, forming a spiral rack, engaged with the teeth of the pulleys 74 on the mobile carriage 72, (as shown conceptually in FIG. 9), the tuning probe (slug) 71 approaching or withdrawing radially from the center conductor 70 and the remote tuning probe control axis mechanism 73.

Figure 1:
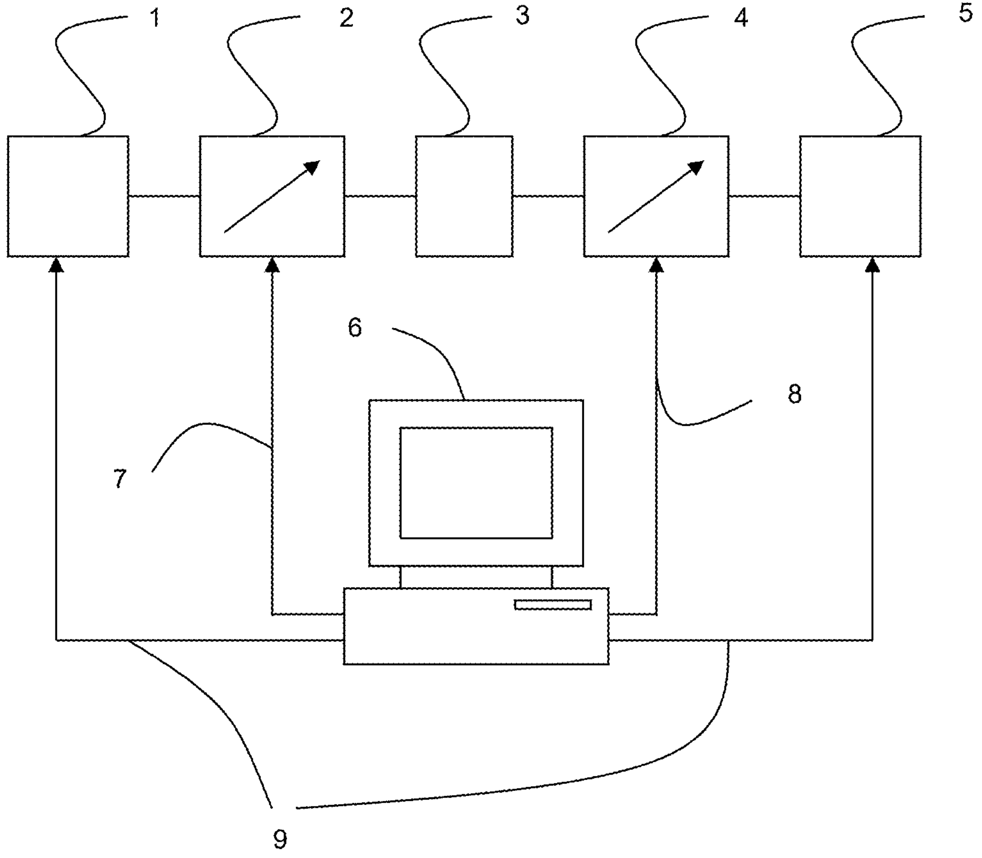
FIG. 1 depicts prior art, a typical automated transistor load pull test system.
Figure 2:
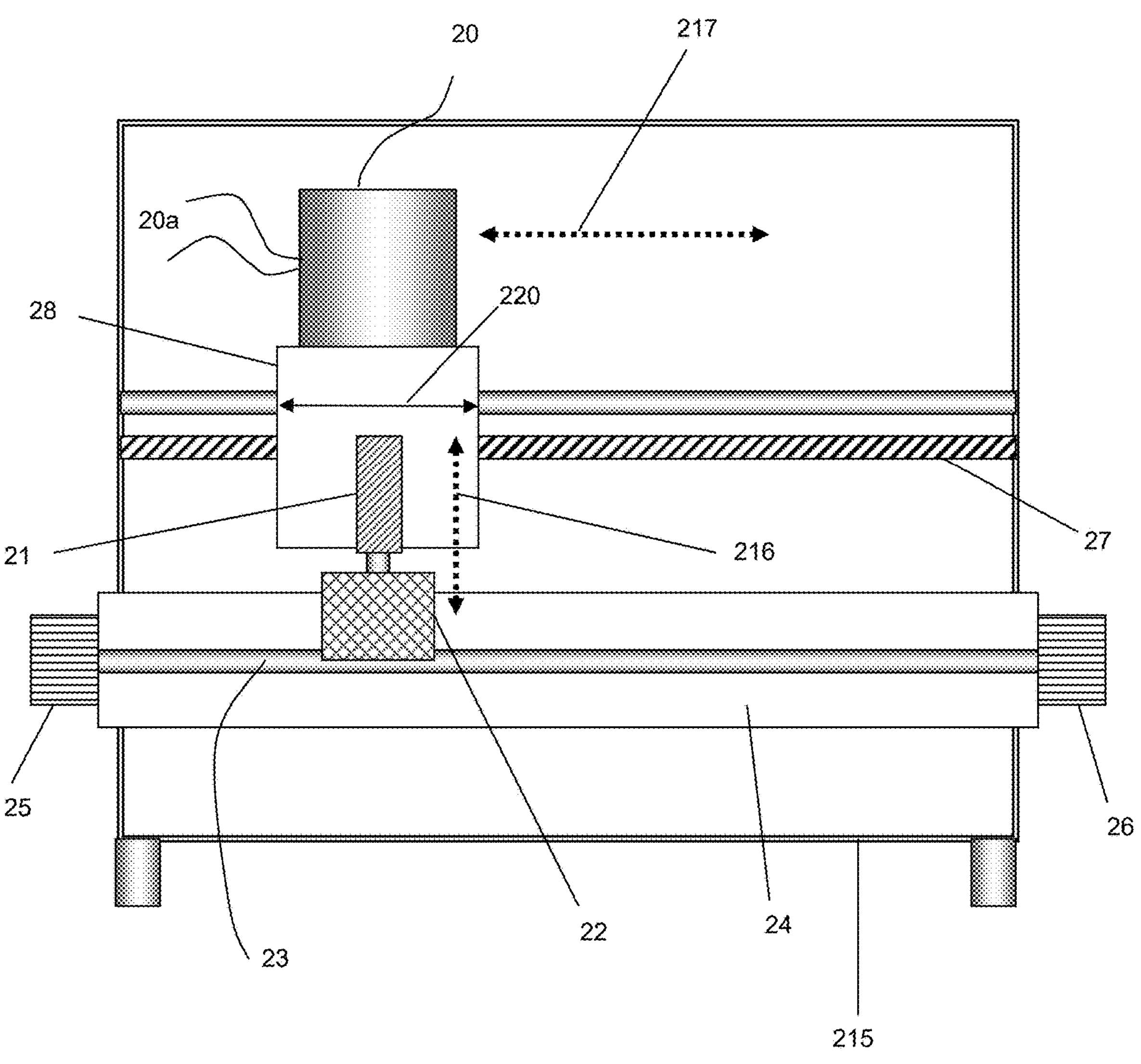
FIG. 2 depicts prior art, a front view of an automated slide screw impedance tuner using a straight slabline, a single vertical axis and RF tuning probe (slug).
Figure 3:
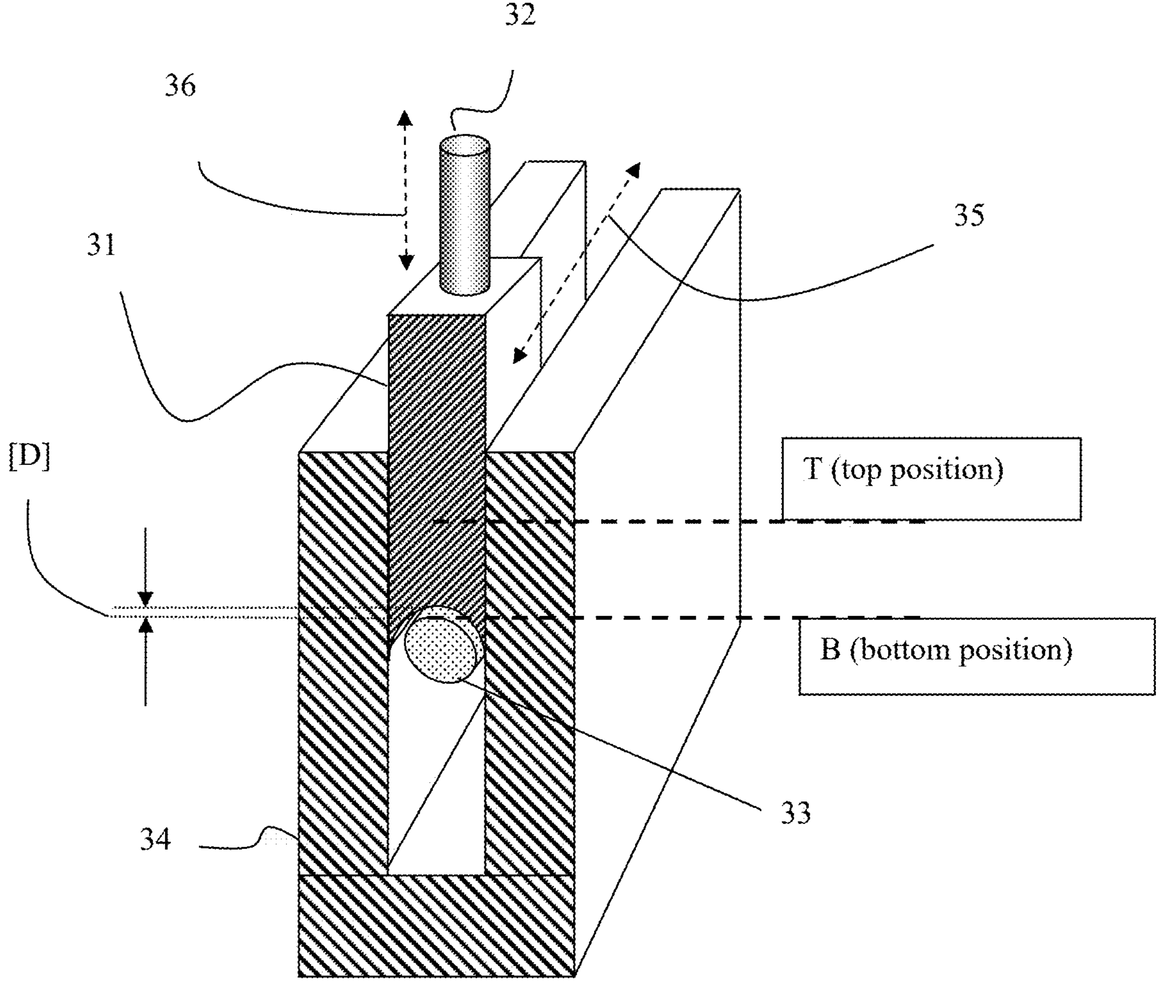
FIG. 3 depicts prior art, RF probe (slug) inside a slotted airline (slabline) approaching the center conductor in a perspective view, and the relevant dimensions and parameters of the operation.
Figure 4:
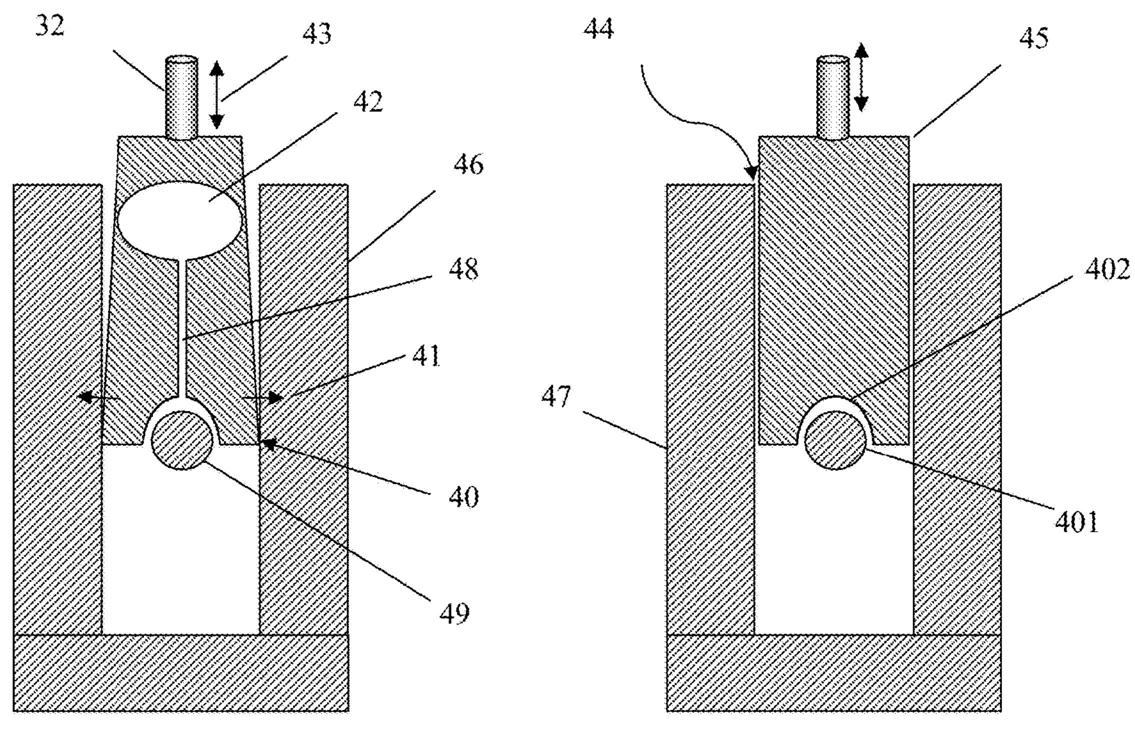
FIGS. 4A through 4B depict prior art, cross section of typical probe configurations.
Figure 8:
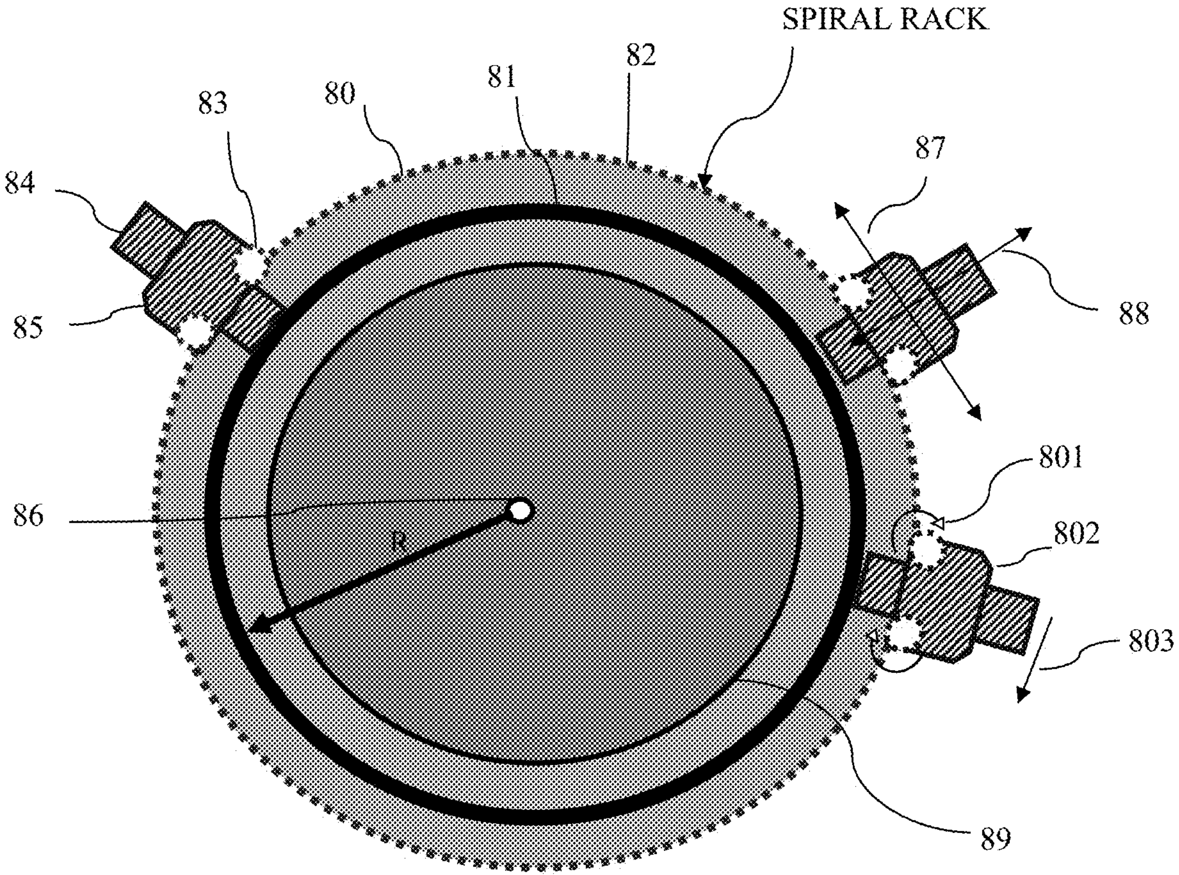
FIG. 8 depicts a top view of the spiral slabline and three mobile carriages on a planetary movement around the center.

FIG. 8 shows a top view of the VHF-UHF slide screw harmonic tuner using three mobile carriages 85 controlled remotely using small pulleys 83 engaged with the teeth (indentations) 80 of the rack-formed edge of the periphery 82 of the spiral slabline in a rack-and-pinion configuration (FIG. 9). The pulleys 83 rotate 801 and pull 803 the carriage 802 together with the tuning probe 84 along the rack 82 built into the periphery of the spiral slabline around a center axis 86 in a screw-kind angular movement 87 from a starting point close to the input port 53 of the slabline at a radius R towards to the output port 54. The reflection factor is controlled by moving 88 the tuning slug 71 towards and away from the center conductor. The width of the channel of the slabline (item 61 in FIG. 6) and the thickness of the sidewalls are dimensioned such that the carriages can pass next to each-other without mechanical conflict. The depth and width of the channel 89 ensures that the spiral center conductor 81 forms a constant characteristic impedance over the whole length of the slabline and minimum residual reflection. To avoid magnetic coupling between the adjacent spires of the center conductor the body of the slabline cylinder could be made using magnetic material or coated with such (like Ni). Each mobile carriage includes a remotely controlled radial axis mechanism that controls a conductive tuning probe as shown in FIGS. 4A and 4B.

FIG. 9 shows a commercially available rack-and-pinion assembly that can be used as a basis for the construction of the spiral tuner in FIG. 8.

This invention has been described in a basic preferred embodiment; obvious alternatives and configurations, to the disclosed concept of circular compact slide screw tuners using rotating carriages on a spiral slabline are possible but shall not impede on to the validity of the present invention.

What is claimed is:

1. A slide screw impedance tuner, comprising:

a test port, an idle port and a spiral slabline between the ports having two conductive sidewalls forming a spiral channel and a spiral center conductor, and one, two or three remotely controlled mobile carriages rolling on a periphery of the sidewalls of the spiral slabline and carrying at least one reflective tuning probe each, remotely insertable into the spiral channel and coupled capacitively with the spiral center conductor;

wherein the periphery of the sidewalls is indented forming a spiral rack;

and wherein the mobile carriages include remotely controlled teethed wheel pulleys, engaged with the indentations of the spiral rack on the sidewalls ensuring travelling of the carriages along the periphery of the sidewalls in a rack-and-pinion configuration;

and wherein an available linear length of the spiral slabline is at least equal to the number of mobile carriages used times one half of a wavelength (λ/2) at a lowest frequency of operation of the slide screw tuner;

and wherein the spiral center conductor is centered between the sidewalls and runs at constant depth from the periphery of the sidewalls.

2. The slide screw impedance tuner of claim 1, wherein the characteristic impedance of the spiral slabline is 50 Ohms.

3. The slide screw impedance tuner of claim 1, wherein the tuning probes are conductive slugs, slide-fitting into the spiral channel of the slabline and having a concave bottom surface matching the spiral center conductor of the slabline.

* * * * *